United States Patent
Chang

(10) Patent No.: US 9,091,192 B2
(45) Date of Patent: Jul. 28, 2015

(54) WASTE HEAT RECOVERY SYSTEM OF VEHICLE

(71) Applicant: Chung-Chien Chang, New Taipei (TW)

(72) Inventor: Chung-Chien Chang, New Taipei (TW)

( * ) Notice: Subject to any disclaimer, the term of this patent is extended or adjusted under 35 U.S.C. 154(b) by 357 days.

(21) Appl. No.: 13/756,553

(22) Filed: Feb. 1, 2013

(65) Prior Publication Data

US 2014/0217953 A1    Aug. 7, 2014

(51) Int. Cl.
*H02J 7/00* (2006.01)
*F01N 5/02* (2006.01)
*F28D 1/00* (2006.01)
*H02J 7/14* (2006.01)

(52) U.S. Cl.
CPC *F01N 5/025* (2013.01); *F01N 5/02* (2013.01); *F28D 1/00* (2013.01); *H02J 7/1415* (2013.01); *F01N 2240/02* (2013.01); *F01N 2590/04* (2013.01); *Y02T 10/16* (2013.01)

(58) Field of Classification Search
CPC ......... F01N 5/025; F28D 21/003; F28D 1/00; H02J 7/00
USPC ....................................................... 320/101
See application file for complete search history.

(56) References Cited

U.S. PATENT DOCUMENTS

| | | | |
|---|---|---|---|
| 7,454,910 B2 * | 11/2008 | Hamada et al. | 60/618 |
| 7,891,186 B1 * | 2/2011 | Primlani | 60/618 |
| 8,397,504 B2 * | 3/2013 | Guzman et al. | 60/616 |
| 8,628,025 B2 * | 1/2014 | Bucknell | 237/12.3 R |
| 8,823,316 B1 * | 9/2014 | Woodall et al. | 320/101 |
| 2010/0207573 A1 * | 8/2010 | Mo et al. | 320/101 |
| 2011/0088397 A1 * | 4/2011 | Mori et al. | 60/661 |
| 2012/0108117 A1 * | 5/2012 | Kwon et al. | 440/6 |
| 2013/0067910 A1 * | 3/2013 | Ishiguro et al. | 60/597 |

* cited by examiner

Primary Examiner — Sun Lin
(74) Attorney, Agent, or Firm — Leong C. Lei

(57) ABSTRACT

A waste heat recovery system of a vehicle generally comprises a heat source, an air-passage body, and a heat-preservation container. The heat source is provided with a pipe. The air-passage body is coupled to the pipe. The air-passage body defines therein a chamber and at least one passage communicating with the chamber, wherein the chamber communicates with the pipe for collecting waste heat energy transferred by the pipe. The heat-preservation container, being placed above the air-passage body, communicates with the passage of the air-passage body and is provided with multiple heat-transfer elements therein. With the waste heat recovery system, the waste heat energy can be transferred via air from the heat source to the container to enable the container to keep at a lower temperature for food or articles required to be warmed. Furthermore, the waste heat energy enables a conversion module in the chamber to generate electrical power.

10 Claims, 4 Drawing Sheets

WASTE HEAT RECOVERY SYSTEM OF VEHICLE

TECHNICAL FIELD OF THE INVENTION

The present invention relates to a waste heat recovery system of a vehicle and, more particular, to a waste heat recovery system that can generate electrical power by using waste heat energy and enables a container thereof to keep at a lower temperature for food or articles required to be warmed.

DESCRIPTION OF THE PRIOR ART

As commonly known, the working temperature of a vehicle's engine is very high, especially when its load is high. In addition to a high temperature of the discharged waste gas, the discharged waste gas is harmful to the environment. To reduce the amount of the waste gas discharged from petroleum vehicles, various electric vehicles or oil electric hybrid vehicles were developed. However, there is inconvenience in driving the electric vehicles before the charging stations are widespread. Also, the price of an electric car or an oil electric hybrid vehicle is still high.

Accordingly, in the transitional period, the manufactures of vehicles may pay attention to a better utilization of the waste heat energy discharged from the existing vehicles. There is a need to improve the existing vehicles to reduce the amount of the waste heat energy discharged from their engines.

Based on the long-term experience of the related works and the constant tests and modifications on the engine system, the applicant has contrived a waste heat recovery system of a vehicle that can utilize the waste heat energy from the engine of a petroleum vehicle or the motor of an electric vehicle to keep food or articles at a warmer temperature and can utilize the waste heat energy to generate electrical power.

SUMMARY OF THE INVENTION

The primary object of the present invention is to provide a waste heat recovery system of a vehicle, which can generate electrical power by using waste heat energy and enables a container thereof to keep at a lower temperature for food or articles required to be warmed.

To achieve the above object, the waste heat recovery system may comprise a heat source, an air-passage body, and a heat-preservation container. The heat source is provided with a pipe that can transfer the waste heat energy generated from the heat source. The air-passage body is coupled to the pipe. The air-passage body defines therein a chamber and at least one passage communicating with the chamber, wherein the chamber communicates with the pipe for collecting the waste heat energy transferred by the pipe. The heat-preservation container is placed above the air-passage body. The heat-preservation container communicates with the passage of the air-passage body and is provided with a plurality of heat-transfer elements therein.

According to one aspect of the present invention, the waste heat recovery system may be installed with a conversion module, which can be a thermoelectric controller and can be electrically connected with an electricity storage module.

According to other aspects of the present invention, the heat source can be an electric motor, a diesel engine, a gasoline engine, or an oil electric hybrid engine, and the passage of the air-passage body is capable of radiating heat.

With the waste heat recovery system, the waste heat energy can be transferred via air from the heat source to the heat-preservation container to enable the container to keep at a lower temperature for food or articles required to be warmed. Furthermore, the waste heat energy enables the conversion module to generate electrical power.

Other objects, advantages, and novel features of the present invention will become more apparent from the following detailed description when taken in conjunction with the accompanying drawings.

DETAILED DESCRIPTION OF THE PREFERRED EMBODIMENTS

To allow the features and advantages of the present invention to be fully understood, embodiments of the present invention will be illustrated in the following paragraphs with reference to the accompanying drawings.

Figure 1:
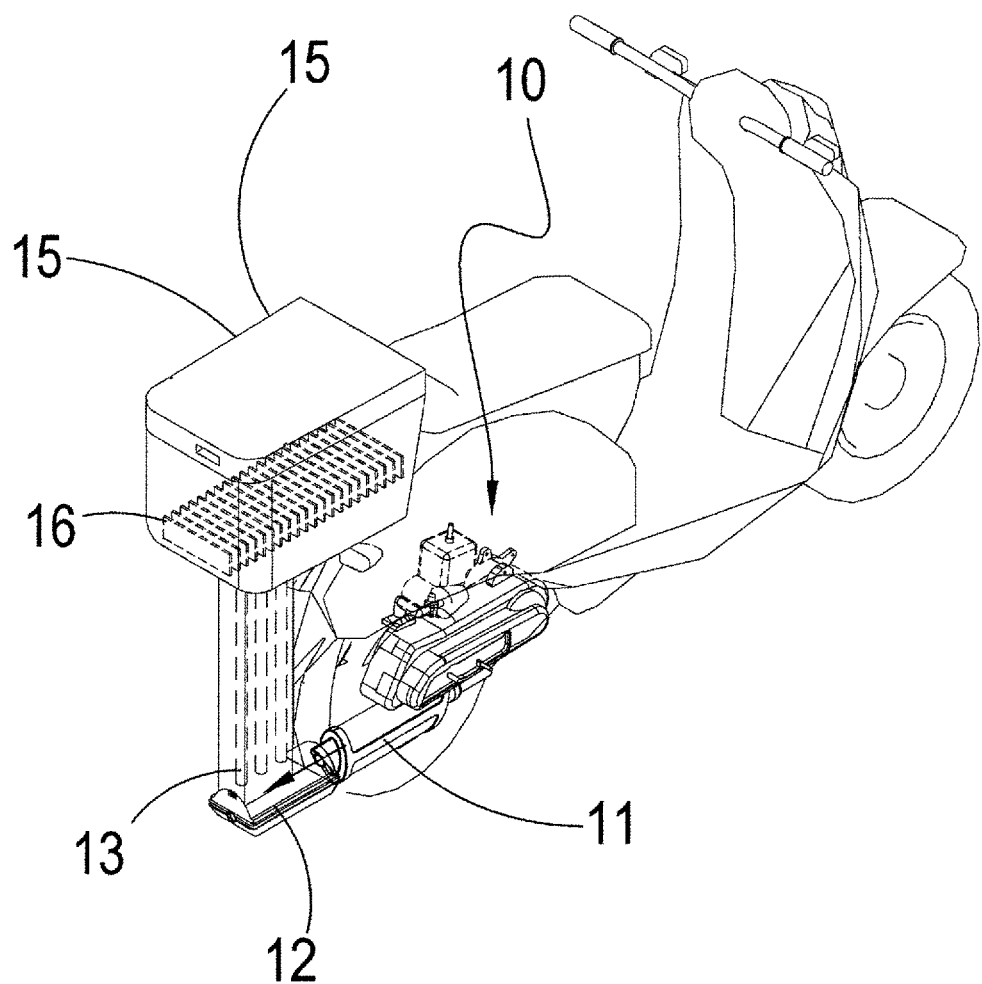
FIG. 1 shows a 3-dimensional view of one embodiment of the present invention.

FIG. 1 shows a waste heat recovery system of a vehicle according to one embodiment of the present invention, wherein the vehicle is shown as a motorcycle, however other types of vehicle can also employ a waste heat recovery system according to the present invention. As shown, the waste heat recovery system generally comprises a heat source 10, an air-passage body 12, and a heat-preservation container 15.

The heat source 10 is provided with a pipe 11 that can transfer the waste heat energy generated from the heat source 10. The heat source 10 can be an electric motor, a diesel engine, a gasoline engine, or an oil electric hybrid engine. The pipe 11 can be a tailpipe or other heat transfer means.

The air-passage body 12 is coupled to the pipe 11 and defines therein a chamber and at least one passage 13 communicating with the chamber, wherein the chamber communicates with the pipe 11 for collecting the waste heat energy transferred by the pipe 11 and the passage 13 is capable of radiating heat.

The air-preservation container 15, which is placed above the air-passage body 12, communicates with the passage of the air-passage body 12. The air-preservation container 15 is provided with a plurality of heat-transfer elements 16 therein, which can be a radiator. Furthermore, the air-passage body 12 defines an air exhaust hole 18 (see FIG. 2) communicating with the chamber thereof. If the heat source 10 is an electric motor, a fan can be installed within the pipe 11 to facilitate transferring the heat energy generated from the electrical motor. With the waste heat recovery system, the waste heat energy can be transferred via air from the heat source 10 of a vehicle to the heat-preservation container 15 to enable the heat-preservation container 15 to keep at a lower temperature for food or articles required to be warmed.

Figure 2:
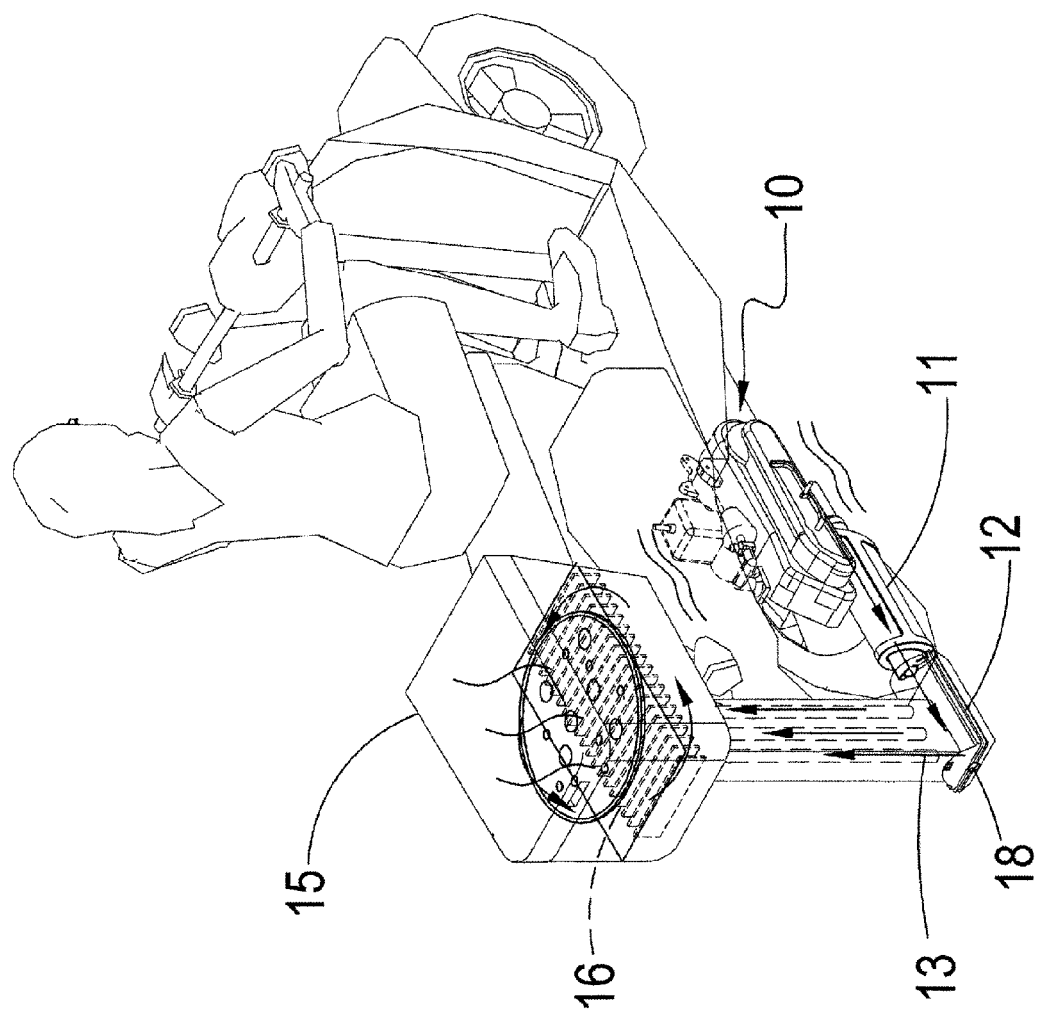
FIG. 2 shows a working view of the embodiment of the present invention.

In operation, as shown in FIG. 2, when starting the heat source 10 (which can be an electric motor, a diesel engine, a gasoline engine, or an oil electric hybrid engine), the waste heat energy generated from the heat source 10 can be transferred via the pipe 11 to the air-passage body 12. Since the specific weight of hot air is less than that of normal air, the waste heat energy contained in the chamber of the air-passage body 12 can be transferred up to the air-preservation container 15 via air. Finally, heat can be radiated from the heat transfer elements 16 within the container 15, thereby enabling the container 16 to keep at a lower temperature for food or articles required to be warmed. At the same time, some of the waste heat energy generated from the heat source 10 can be transferred to the ambient environment via the air exhaust hole 18 or the body embodying the passage 13.

Figure 3:
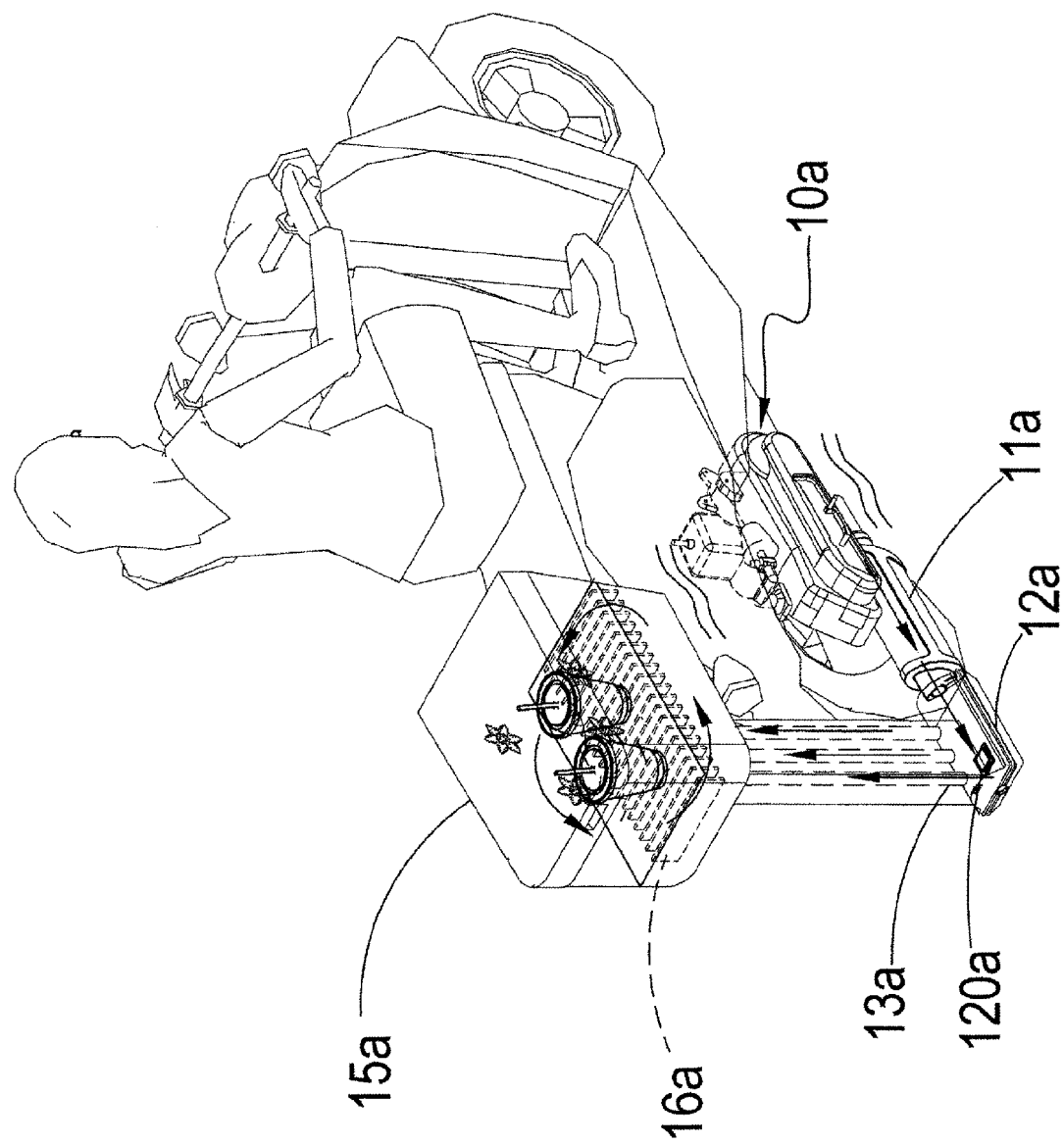
FIG. 3 shows a working view of a modified embodiment of the present invention.
Figure 4:
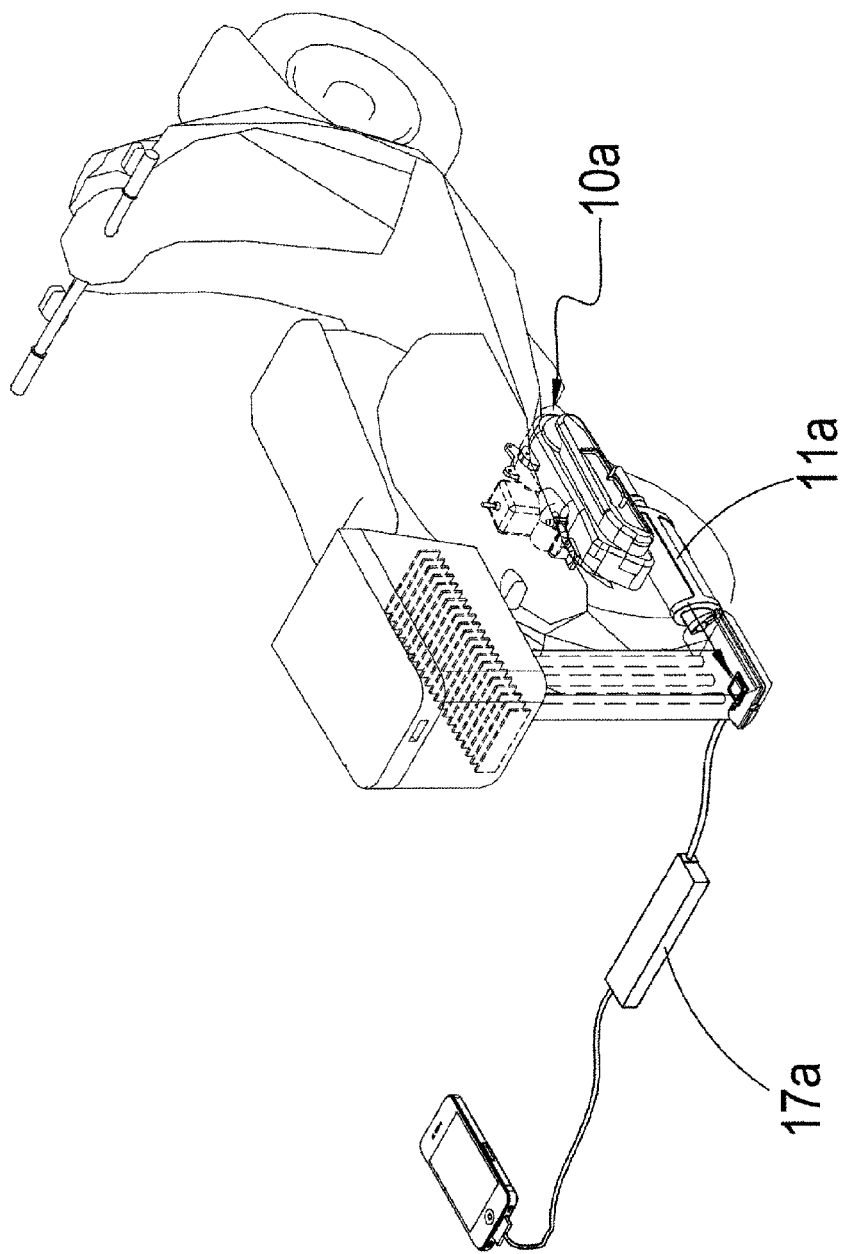
FIG. 4 shows another working view of the modified embodiment of the present invention.

FIGS. 3 and 4 show a modified embodiment of the present invention. As shown, the embodiment includes a conversion module 120a installed in the chamber of the air-passage body 12a. The conversion module 120a can be a thermoelectric controller, which can be electrically connected with an electricity storage module 17a. In operation, when starting the heat source 10a (which can be an electric motor, a diesel engine, a gasoline engine, or an oil electric hybrid engine), the waste heat energy generated from the heat source 10 can be transferred via the pipe 11a to the air-passage body 12a. The conversion module 120a touches hot air transferred from the pipe 11a at one side thereof facing towards the pipe 11a and touches less hot air at another side facing towards the passage 13a, thereby enabling the conversion module 120a to generate electrical power. The less hot air can pass through the passage 13a and reach the heat transfer elements 16a within the air-preservation container 15a, where food or article can be put for obtaining a warmer temperature. When the conversion module 120a is electrically connected with an electricity storage module 17a, the electricity storage module 17a can be charged through the temperature differences between the two sides of the conversion module 120a.

In conclusion, the present invention has the following advantages over the prior art:

The waste heat energy discharged from the heat source of a vehicle can be utilized through a conversion module to generate electrical power. On the other hand, the waste heat energy enables a heat-preservation container to keep at a lower temperature for food or articles required to be warmed. Thus, the present invention is a useful creation.

Although the present invention has been described with a certain degree of particularity, it is understood that the present disclosure is made by way of example only and the combination and arrangement of parts may be resorted to without departing from the spirit and scope of the invention hereinafter claimed.

I claim:

1. A waste heat recovery system of a vehicle, comprising:
   a heat source provided with a pipe that can transfer waste heat energy generated from the heat source;
   an air-passage body coupled to the pipe, the air-passage body defining therein a chamber and at least one passage communicating with the chamber, wherein the chamber communicates with the pipe for collecting the waste heat energy transferred by the pipe; and
   a heat-preservation container placed above the air-passage body, the heat-preservation container communicating with the passage of the air-passage body and being provided with a plurality of heat-transfer elements therein;
   whereby the waste heat energy can be transferred via air from the heat source to the heat-preservation container to enable the heat-preservation container to keep at a lower temperature for food or articles to be warmed.

2. The waste heat recovery system as claimed in claim 1, wherein at least one conversion module is installed within the air-passage body.

3. The waste heat recovery system as claimed in claim 2, wherein the conversion module is a thermoelectric controller.

4. The waste heat recovery system as claimed in claim 3, wherein the conversion module is connected with an electricity storage module.

5. The waste heat recovery system as claimed in claim 1, wherein the heat source is an electric motor, a diesel engine, a gasoline engine, or an oil electric hybrid engine.

6. The waste heat recovery system as claimed in claim 1, wherein the pipe is a tailpipe or heat transfer means.

7. The waste heat recovery system as claimed in claim 1, wherein the passage of the air-passage body is capable of radiating heat.

8. The waste heat recovery system as claimed in claim 1, wherein the air-passage body defines an air exhaust hole communicating with the chamber thereof.

9. The waste heat recovery system as claimed in claim 1, wherein a fan is installed within the pipe.

10. The waste heat recovery system as claimed in claim 1, wherein the heat-transfer elements is a radiator.

* * * * *